United States Patent
Maruyama

(10) Patent No.: US 7,586,432 B2
(45) Date of Patent: Sep. 8, 2009

(54) A/D CONVERTER

(75) Inventor: Masahiko Maruyama, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/019,565

(22) Filed: Jan. 24, 2008

(65) Prior Publication Data
US 2008/0198049 A1 Aug. 21, 2008

(30) Foreign Application Priority Data
Jan. 25, 2007 (JP) .............................. 2007-014917

(51) Int. Cl.
*H03M 1/56* (2006.01)
(52) U.S. Cl. ..................... 341/169; 341/155; 341/156
(58) Field of Classification Search ................ 341/155, 341/156, 165, 169
See application file for complete search history.

(56) References Cited

U.S. PATENT DOCUMENTS

| | | | | |
|---|---|---|---|---|
| 5,731,735 A | * | 3/1998 | Yokota et al. | ............... 327/535 |
| 5,796,673 A | * | 8/1998 | Foss et al. | ................ 365/233.1 |
| 5,990,715 A | * | 11/1999 | Nishimura | ................ 327/158 |
| 6,072,345 A | * | 6/2000 | Ooishi | ........................ 327/157 |
| 6,081,145 A | * | 6/2000 | Bandai et al. | ............... 327/231 |
| 6,259,288 B1 | | 7/2001 | Nishimura | |
| 6,522,182 B2 | | 2/2003 | Tomita et al. | |

FOREIGN PATENT DOCUMENTS

| | | |
|---|---|---|
| JP | 57-160221 A | 10/1982 |
| JP | 10-171774 A | 6/1998 |
| JP | 2000-124797 A | 4/2000 |
| JP | 2000-286706 A | 10/2000 |

\* cited by examiner

*Primary Examiner*—Jean B Jeanglaude
(74) *Attorney, Agent, or Firm*—Birch, Stewart, Kolasch & Birch, LLP

(57) ABSTRACT

An A/D converter compares one or more analog voltages to be converted with a reference voltage given by a voltage change value of ramp voltage whose voltage value changes monotonically for a certain period or a voltage proportional to the voltage change value, converts each analog voltage to a digital value corresponding to the reference voltage, and outputs it, the A/D converter comprising an arithmetic unit for comparison between the analog voltage and reference voltage with respect to each analog voltage, the arithmetic unit having a first power supply line for receiving a power supply voltage, wherein the first power supply line is provided as another power supply line not affected by voltage fluctuation of a second power supply line for supplying a system power supply voltage by providing a MOS transistor whose gate terminal is connected to a stabilized voltage source between the first and second power supply lines.

9 Claims, 14 Drawing Sheets

A/D CONVERTER

CROSS REFERENCE TO RELATED APPLICATION

This Nonprovisional application claims priority under 35 U.S.C. §119(a) on Patent Application No. 2007-014917 filed in Japan on 25 Jan. 2007 the entire contents of which are hereby incorporated by reference.

BACKGROUND OF THE INVENTION

1. Field of the Invention

The present invention relates to an A/D (analog-digital) converter in which one or more analog voltages to be converted are sampled and held and the sampled and held one or more analog voltages to be converted are compared with a reference voltage given by a voltage change value of a ramp voltage having a voltage value changing monotonically for a certain period or a voltage proportional to the voltage change value, and each of the one or more analog voltages to be converted is converted to a digital value corresponding to the reference voltage and outputted, and more particularly, to a column-type A/D converter.

2. Description of the Related Art

Recently, high speed and low power consumption are increasingly demanded in a A/D converter used in a solid-state image sensor. In order to satisfy the above demand, a column-type A/D converter is used in many cases (refer to Japanese Unexamined Patent Publication No. 2000-286706).

FIG. 1 is a block diagram showing a conventional column-type A/D converter. A column-type A/D converter 11 comprises an inverter circuit 12, a switch RS to short-circuit an input node CPI and an output node CPO of the inverter circuit 12, a capacitor CS to sample an analog voltage to be converted, a capacitor CR and a switch S3 to transmit a ramp voltage $V_{RAMP}$ changing its voltage value monotonically for a certain period, to the input node CPI, a switch SS to sample the analog voltage to be converted, and a latch circuit 13 to latch a counter output corresponding to the analog voltage to be converted as circuit elements. Furthermore, in FIG. 1, a ramp voltage source 14 to generate the ramp voltage $V_{RAMP}$, a counter 15 to count and output a digital value (n-bit binary signal) corresponding to the voltage value change of the ramp voltage, and a pixel part 16 of a solid-state image sensor for the column-type A/D converter 11 are illustrated.

The A/D conversion operation of the column-type A/D converter 11 will be described with reference to a timing chart shown in FIG. 2.

At a timing t1, when a switch RX of the pixel part 16 is turned on, a node FD is reset to a voltage $V_{DD}$, a node VIN is charged to a high potential through a MOS transistor MA. In addition, the switch RS is turned on at the same time, and the input node CPI and the output node CPO of the inverter circuit 12 are short-circuited and the input node CPI is automatically reset to an input determination voltage (auto-zero level) of the inverter circuit 12. Although the switch SS is turned on at the same time, switches S3 and TX are in off state.

At a timing t2, when the switch RX is turned off, a reset voltage appears at the node VIN. At a timing t3, when the switch RS is turned off, a reset voltage is sampled in the capacitor CS.

Then, at a timing t4, when the switch Tx is turned on, a photoelectric conversion is performed by a photoelectric conversion element (photodiode) PD of the pixel part 16 and accumulated electric charge is transferred to the node FD, so that the node VIN is shifted to a voltage level (photoelectric conversion level) corresponding to the photoelectric-converted electric charge amount. When the voltage level of the node VIN is stabilized at a timing t5 and the switch Tx is turned off and the switch S3 is turned on, a voltage difference between the voltage level (photoelectric conversion level) of the node VIN at that time and an initial voltage of the ramp voltage $V_{RAMP}$ is held in the capacitor CR.

Sequentially, at a timing t6, when the switch SS is turned off, a differential value $V_{SIG}$ between the reset voltage (timing t3) and the photoelectric conversion level (timing t6) of the node VIN is held in the input node CPI as an analog voltage to be converted.

At a timing t7, when a voltage value of the ramp voltage $V_{RAMP}$ starts to increase gradually, the voltage of the input node CPI is also increased so as to be proportional to the voltage increase of the ramp voltage $V_{RAMP}$. In addition, at the timing t7, the counter 15 starts to count at the same time.

At a timing t8, when the voltage level of the input node CPI exceeds the input determination voltage of the inverter circuit 12, the inverter circuit 12 inverts the output level of the output node CPO. The latch circuit 13 holds the value of the counter output in response to output change of the output node CPO.

Here, the differential value $V_{SIG}$ corresponds to an incident light amount to the photoelectric conversion element PD, and the value of the latched counter output is equal to an A/D conversion value (digital value) of the differential $V_{SIG}$. Thus, when the A/D conversion value held by the latch circuit 13 is outputted, the column-type A/D converter 11 completes the A/D conversion operation of the analog voltage $V_{SIG}$ to be converted.

FIG. 3 shows input/output characteristics of the inverter circuit 12 that compares the analog voltage $V_{SIG}$ to be converted with the voltage increased value of the ramp voltage $V_{RAMP}$, in the column-type A/D converter 11. The inverter circuit 12 executes the voltage comparison by comparing the difference voltage between the analog voltage $V_{SIG}$ to be converted and the voltage increased value of the ramp voltage $V_{RAMP}$ as an input voltage, with the auto-zero level of the input determination voltage.

The auto-zero level is a voltage provided when the input and output of the inverter circuit 12 are short-circuited, and the voltage is at an intersection of an input/output characteristic curve A of the inverter with a straight line B in which the input voltage Vin equals the output voltage Vout (Vin=Vout).

When it is assumed that the threshold values of the P channel-type MOSFET and the N channel-type MOSFET in the inverter circuit 12 are Vthp and Vthn, respectively and their transfer conductance are βp and βn, since the current amounts flowing through both MOSFETs of the inverter circuit 12 are equal, the following formula 1 is provided. In addition, in the formula 1, $V_{DD}$ is a power supply voltage supplied to the source terminal of the P channel-type MOSFET, and $V_X$ is an auto-zero level and $V_X$ is expressed by the formula 2.

$$\beta n/2 \times (Vx-Vthn)^2 = \beta p/2 \times (V_{DD}-Vx-Vthp)^2 \quad (1)$$

$$Vx=Vin=Vout \quad (2)$$

When the equation of the formula 1 is solved for Vx, the auto-zero level Vx is expressed by the following formula 3.

$$Vx=\{(\beta n/\beta p)^{1/2} \times Vthn + V_{DD} - Vthp\}/(1+(\beta n/\beta p)^{1/2}) \quad (3)$$

It can be understood from the formula 3 that the voltage fluctuation of the auto-zero level Vx is proportional to the voltage fluctuation of the power supply voltage $V_{DD}$.

FIG. 4 shows input/output characteristics of the inverter circuit when the power supply voltage $V_{DD}$ fluctuates. As schematically shown in FIG. 4, when the power supply voltage $V_{DD}$ fluctuates by a voltage A, the auto-zero level Vx shifts from Vx1 to Vx2.

The influence of the power supply voltage fluctuation on the latch output (counter output value held in and outputted from the latch circuit 13) will be described with reference to a timing chart shown in FIG. 5.

When the power supply voltage $V_{DD}$ fluctuates only by the voltage Δ during the A/D conversion operation, since the auto-zero level shifts from Vx1 to Vx2, the falling timing of the output node CPO of the inverter circuit shifts from t8 to t9. That is, the latch output value is changed because the timing to latch the counter output is delayed. Such influence due to the power supply voltage fluctuation causes the fluctuation of the A/D conversion output directly. Therefore, the digital image from the solid-state image sensor is superimposed with a noise according to the power supply voltage fluctuation.

SUMMARY OF THE INVENTION

The present invention was made in view of the above problems and it is an object of the present invention to provide an A/D converter in which power supply voltage fluctuation is prevented from affecting an A/D conversion operation.

According to the present invention to attain the above object, an A/D converter samples and holds one or more analog voltages to be converted, compares the sampled and held one or more analog voltages to be converted with a reference voltage given by a voltage change value of a ramp voltage having a voltage value changing monotonically for a certain period or a voltage proportional to the voltage change value, converts each of the one or more analog voltages to be converted to a digital value corresponding to the reference voltage, and outputs it, and it is characterized in that an arithmetic unit used for comparing each of the one or more analog voltages to be converted with the reference voltage is provided with respect to each of the analog voltages to be converted, each of the arithmetic unit has a first power supply line for receiving a power supply voltage individually, and each of the first power supply lines is provided as another power supply line not affected by a voltage fluctuation of a second power supply line for supplying a power supply voltage to circuits other than the arithmetic unit, as first characteristics.

According to the A/D converter having the first characteristics, since the first power supply line to supply the power supply voltage to the arithmetic unit is provided as another power supply line that is not affected by the voltage fluctuation of the second power supply line to supply the power supply voltage to the circuits other than the arithmetic unit, the power supply voltage level of the first power supply line is stabilized without being affected by the voltage fluctuation of the second power supply line. Therefore, since the A/D conversion by voltage comparison by the arithmetic unit is not affected by the voltage fluctuation of the second power supply line, the A/D converter can perform the A/D conversion operation stably with a low noise.

In addition to the first characteristics, the A/D converter according to the present invention is characterized by comprising an N channel-type MOSFET having a source terminal and a drain terminal connected to the first power supply line and the second power supply line, respectively, and a first stabilized voltage source for outputting a stabilized voltage not affected by the voltage fluctuation of the second power supply line, to a gate terminal of the N channel-type MOSFET, as second characteristics.

According to the A/D converter having the second characteristics, since the stabilized voltage can be supplied from the second power supply line to the first power supply line through the N channel-type MOSFET, it is not necessary to supply the stabilized power supply voltage to the first power supply line separately, so that the circuit constitution can be simplified.

In addition to the first or second characteristics, the A/D converter according to the present invention is characterized in that a first ground voltage line for supplying a ground voltage to the arithmetic unit is provided as another ground voltage line not affected by a voltage fluctuation of a second ground voltage line for supplying a ground voltage to circuits other than the arithmetic unit, as third characteristics.

According to the A/D converter having the third characteristics, since the first ground voltage line to supply the ground voltage to the arithmetic unit is provided as another ground voltage line not affected by the voltage fluctuation of the second ground voltage line to supply the ground voltage to the circuits other than the arithmetic unit, the ground voltage level of the first ground voltage line can be stabilized without being affected by the voltage fluctuation of the second ground voltage line. Accordingly, the A/D conversion by the voltage comparison of the arithmetic unit is not affected by the voltage fluctuation of the second ground voltage line, and the A/D converter can perform the A/D conversion operation more stably with a low noise.

In addition to the third characteristics, the A/D converter according to the present invention is characterized by comprising a P channel-type MOSFET having a source terminal and a drain terminal connected to the first ground voltage line and the second ground voltage line, respectively, and a second stabilized voltage source for outputting a stabilized voltage not affected by the voltage fluctuation of the second ground voltage line, to a gate terminal of the P channel-type MOSFET, as fourth characteristics.

According to the A/D converter having the fourth characteristics, since the stabilized voltage can be supplied from the second ground voltage line to the first ground voltage line through the P channel-type MOSFET, it is not necessary to supply the stabilized ground voltage to the first ground voltage line separately so that the circuit constitution can be simplified.

In addition to the second characteristics, the A/D converter according to the present invention further comprises the plurality of arithmetic units capable of converting the plurality of analog voltages to be converted to the digital values, respectively, and it is characterized in that the gate terminals of the plurality of N channel-type MOSFETs connected to the first power supply lines of the plurality of arithmetic units, respectively are connected to each other, and an output voltage of the first stabilized voltage source is outputted to each of the gate terminals of the plurality of N channel-type MOSFETs, as fifth characteristics.

According to the A/D converter having the fifth characteristics, when the plurality of analog voltages to be converted are A/D converted in parallel, the influence of the voltage fluctuation of the second power supply line on the A/D conversion by the voltage comparison of the arithmetic unit can be effectively prevented by the simple circuit constitution, and the A/D converter can perform the A/D conversion operation more stably with a low noise.

In addition to the fourth characteristics, the A/D converter according to the present invention further comprises the plurality of arithmetic units capable of converting the plurality of analog voltages to be converted to the digital values, respectively, and it is characterized in that the gate terminals of the plurality of P channel-type MOSFETs connected to the first ground voltage lines of the plurality of arithmetic units, respectively are connected to each other, and an output voltage of the second stabilized voltage source is outputted to each of the gate terminals of the plurality of P channel-type MOSFETs, as sixth characteristics.

According to the A/D converter having the above sixth characteristics, when the plurality of analog voltages to be converted are A/D converted in parallel, the influence of the voltage fluctuation of the second ground voltage line on the A/D conversion by the voltage comparison of the arithmetic unit can be effectively prevented by the simple circuit constitution, and the A/D converter can perform the A/D conversion operation stably with a low noise.

In addition to any one of first to sixth characteristics, the A/D converter according to the present invention is characterized by comprising a ramp voltage generator unit for generating the ramp voltage, a counter for counting a digital value corresponding to the reference voltage and outputting it, a voltage comparison circuit for sampling and holding the analog voltage to be converted and comparing the reference voltage with the analog voltage to be converted by the arithmetic unit, and changing an output when the reference voltage equals the analog voltage to be converted, and a latch circuit for latching the digital value outputted from the counter when the output of the voltage comparison circuit is changed, and outputting the latched digital value, as seventh characteristics.

In addition to any one of first to seventh characteristics, the A/D converter according to the present invention is characterized in that the arithmetic unit comprises an inverter circuit, and the A/D converter comprises a voltage synthesis circuit for generating a composite voltage provided by adding a differential voltage between the analog voltage to be converted and the reference voltage, to an input determination voltage of the inverter circuit, as an input voltage of the inverter circuit, as eighth characteristics.

In addition, to the any one of first to seventh characteristics, the A/D converter according to the present invention is characterized in that the arithmetic unit comprises a differential input type operation amplifier receiving the analog voltage to be converted and the ramp voltage as input voltages, as ninth characteristics.

According to the A/D converter having the above seventh to ninth characteristics, the A/D converter exhibiting the effect of the any one of the first to sixth characteristics can be specifically implemented with the simple circuit constitution.

DETAILED DESCRIPTION OF THE INVENTION

Embodiments of an A/D converter according to the present invention (hereinafter, suitably abbreviated as "device of the present invention") will be described with reference to the drawings hereinafter. In addition, in each drawing to explain the device of the present invention, the same references as those in the conventional A/D converter shown in FIG. 1 are allotted to the same circuit elements, nodes, and signals to simplify the understanding of the description.

First Embodiment

Figure 6:
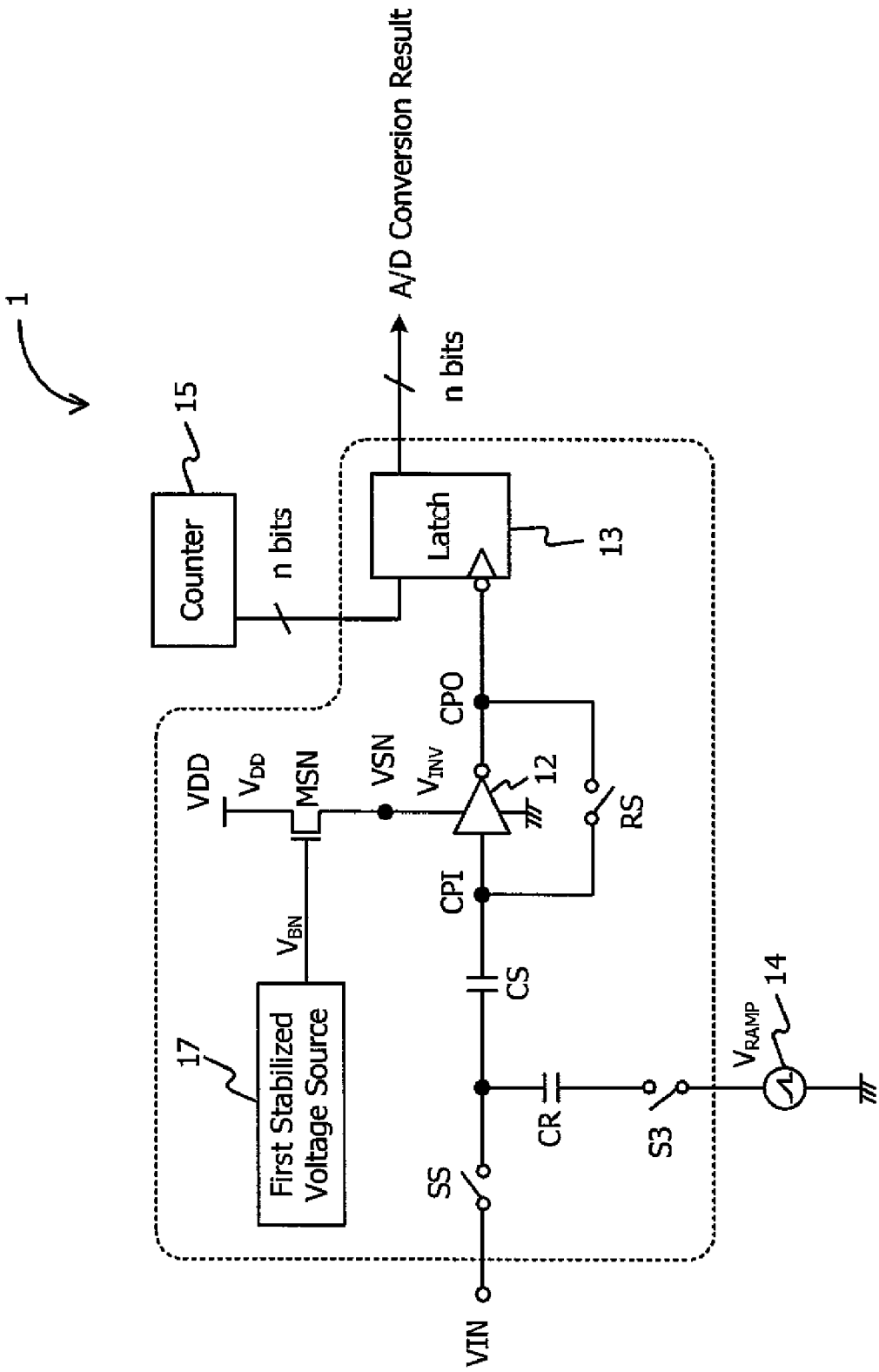
FIG. 6 is a circuit block diagram showing a circuit constitution example according to a first embodiment of the A/D converter in the present invention.

FIG. 6 shows a circuit constitution of the device of the present invention in a first embodiment. The device 1 of the present invention according to the first embodiment is configured with an inverter circuit 12, a switch RS to short-circuit an input node CPI and an output node CPO of the inverter circuit 12, a switch SS and a capacitor CS to sample an inputted analog voltage to be converted from an input node VIN of the device 1 of the present invention, a switch S3 and capacitor CR to transmit a reference voltage, that is proportional to a voltage change of a ramp voltage $V_{RAMP}$ having a voltage value changing monotonically for a certain period, to the input node CPI, a latch circuit 13 to latch a counter output corresponding to the analog voltage to be converted, a ramp voltage source 14 to generate the ramp voltage $V_{RAMP}$, and a counter 15 to count a digital value (n-bit binary signal) corresponding to the reference voltage that is proportional to the voltage change value of the ramp voltage $V_{RAMP}$ and output it. In addition, although an analog voltage such as a voltage $V_{SIG}$ corresponding to an incident light amount outputted from the pixel part 16 of the solid-state image sensor, to the photoelectric conversion element PD shown in the block diagram of the conventional column-type A/D converter in FIG. 1 is inputted to the input node VIN, the analog voltage to be converted is not limited to the photoelectric conversion output of the photoelectric conversion element PD.

Figure 1:
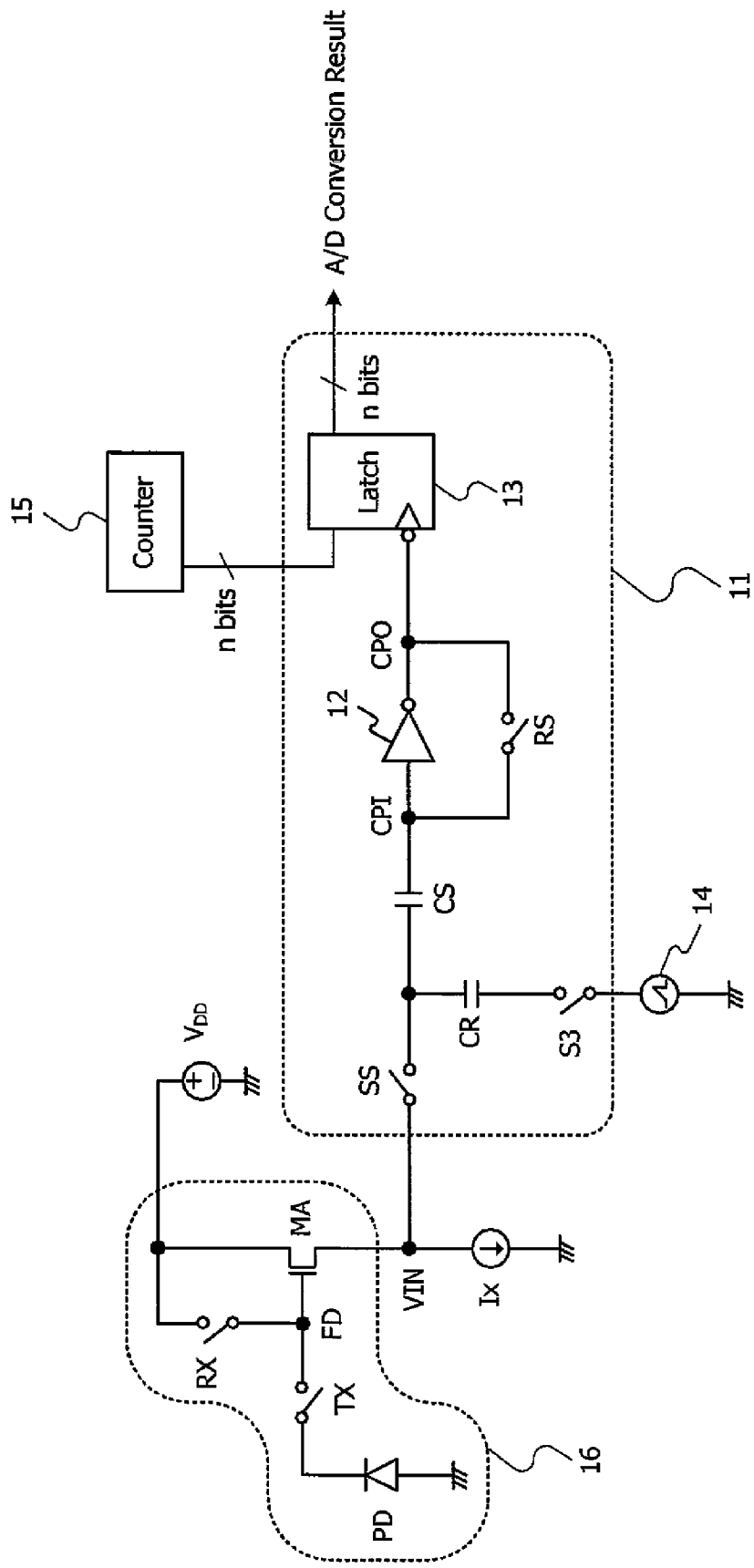
FIG. 1 is a circuit block diagram showing one circuit constitution of a conventional column-type A/D converter.

Circuit elements constituting the device 1 of the present invention are the same as those constituting the conventional A/D converter shown in FIG. 1. According to the device 1 of the present invention, in addition to the above circuit elements, a first power supply line VSN to supply a special power supply voltage $V_{INV}$ to the inverter circuit 12, and a system power supply line VDD (corresponding to a second power supply line) to supply a system power supply voltage $V_{DD}$ to a whole system except for the inverter circuit 12 are separately provided, so that the voltage fluctuation of the system power supply voltage $V_{DD}$ does not affect the first power supply line VSN as shown in FIG. 6. According to the device 1 of the present invention, in order to prevent a power supply voltage other than the system power supply voltage $V_{DD}$ from being supplied from the outside to the first power supply line VSN, an N channel-type MOSFET (transistor MSN) whose source terminal and drain terminal are connected to the first power supply line VSN and the system power supply line VDD, respectively and a first stabilized voltage source 17 to supply a stabilized voltage $V_{BN}$ that is not affected by the voltage fluctuation of the system power supply voltage $V_{DD}$ to a gate terminal of the transistor MSN are provided. Since the transistor MSN performs a source-follower operation, the voltage $V_{INV}$ supplied to the first power supply line VSN is expressed by the following formula 4. In the formula 4, Vthsn and βsn are a threshold voltage of the transistor MSN and conductivity coefficient β expressed by the formula 5, respectively and $I_B$ is a penetration current penetrating the inverter circuit 12 at the time of auto-zero (the input node CPI and the output node CPO are short-circuited). In addition, in the formula 5, W and L are a channel width and a channel length of the transistor, respectively, and $\in_{OX}$ and $t_{OX}$ are a dielectric constant and a film thickness of a gate insulation film, and μ is a carrier mobility in a channel.

$$V_{INV}=V_{BN}-Vthsn-(2\times I_B/\beta sn)^{1/2} \quad (4)$$

$$\beta=W\times\in_{OX}\times\mu/(2\times L\times t_{OX}) \quad (5)$$

As is clear from the formula 4, the power supply voltage $V_{INV}$ that is not affected by the voltage fluctuation of the system power supply voltage $V_{DD}$ is supplied to the inverter circuit 12. That is, a new auto-zero level Vx' of the device 1 of the present invention is expressed by the formula 6, and not affected by the voltage fluctuation of the system power supply voltage $V_{DD}$. As a result, the voltage fluctuation of the system power supply voltage $V_{DD}$ hardly affects an A/D conversion result.

$$Vx'=\{(\beta n/\beta p)^{1/2}\times Vthn+V_{INV}-Vthp\}/\{1+(\beta n/\beta p)^{1/2}\} \quad (6)$$

In the circuit constitution shown in FIG. 6, the inverter circuit 12, the switch RS, the switch SS and the capacitor CS, the switch S3 and the capacitor CR, and the transistor MSN constitute a voltage comparison circuit in which the analog voltage to be converted is sampled and held, the reference voltage that is proportional to the voltage change value of the ramp voltage $V_{RAMP}$ is compared with the analog voltage to be converted, and when the reference voltage equals the analog voltage to be converted, an output is changed. According to the first embodiment, the inverter circuit 12 functions as an arithmetic unit used when the reference voltage is compared with the analog voltage to be converted. In addition, the switches RS, SS and S3 and the capacitors CS and CR constituting the voltage comparison circuit functions as a voltage synthesis circuit to generate a composite voltage provided by adding a difference voltage between the analog voltage to be converted and the reference voltage to an input determination voltage Vx (refer to the formula 3) of the inverter circuit 12, at the input node CPI as an input voltage of the inverter circuit 12.

Figure 2:
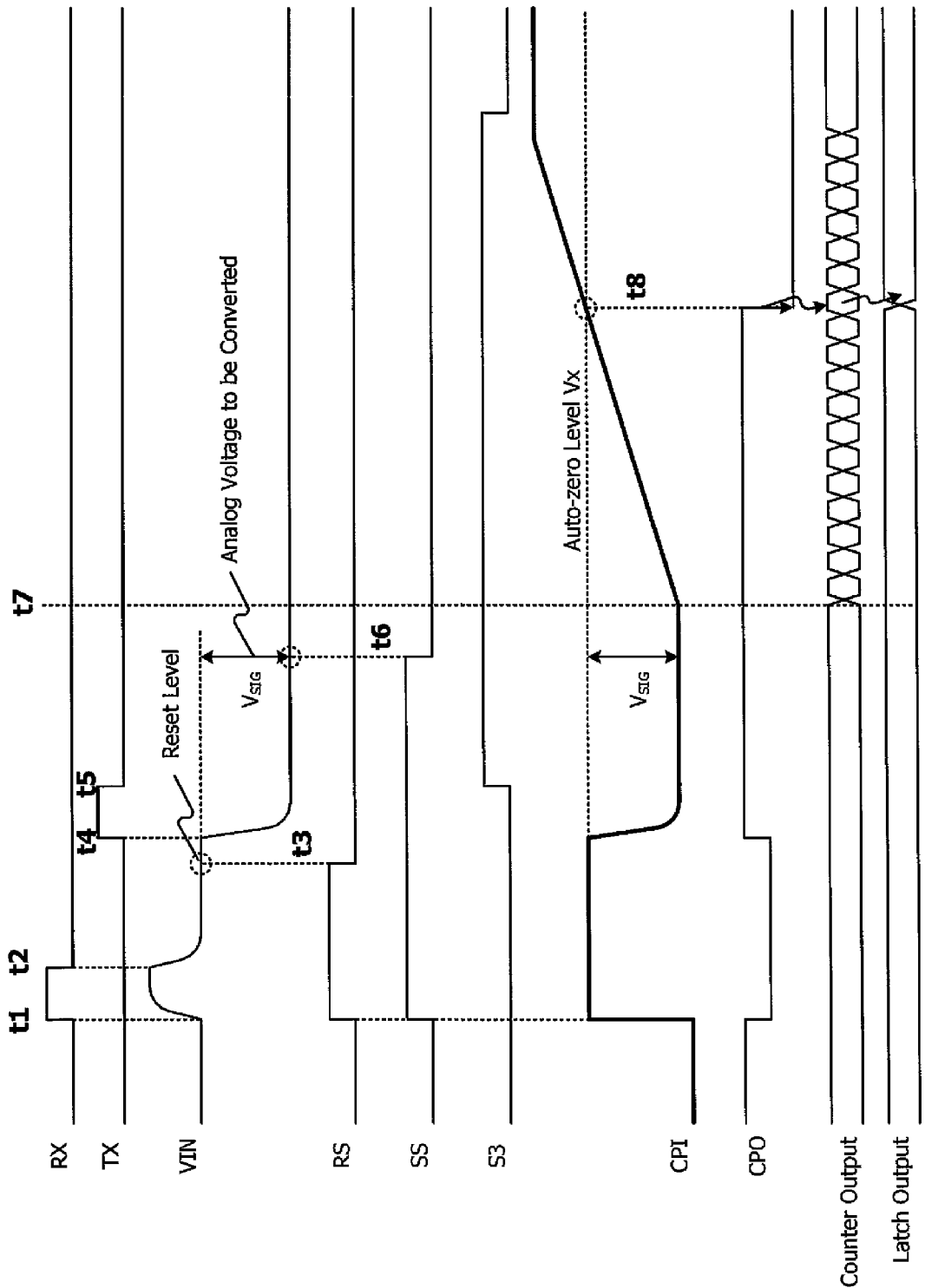
FIG. 2 is a timing chart schematically showing a circuit operation of the A/D converter shown in FIG. 1.
Figure 3:
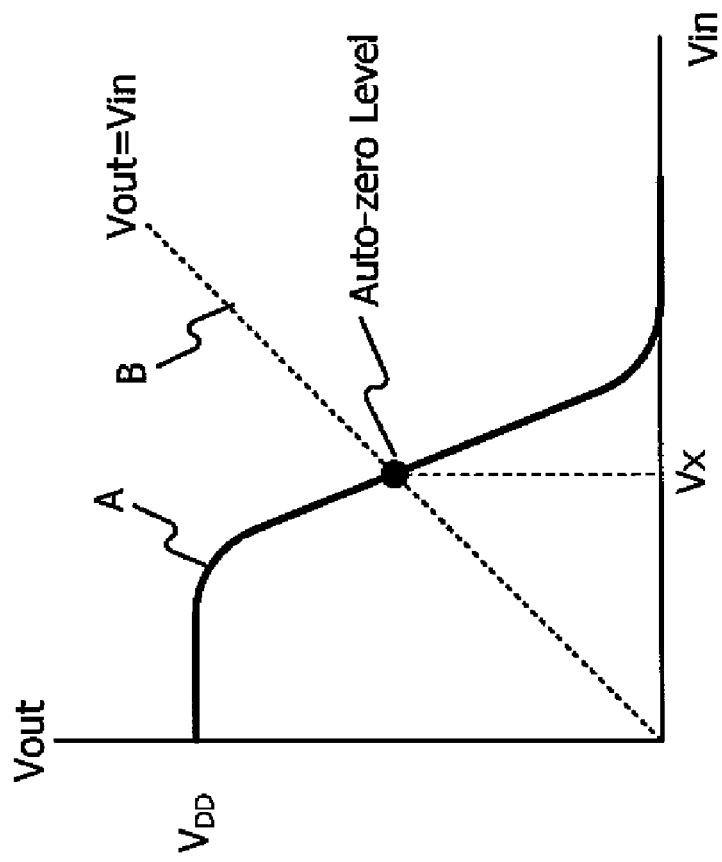
FIG. 3 is a view showing a transistor circuit diagram and input/output characteristics of an inverter circuit.
Figure 3:
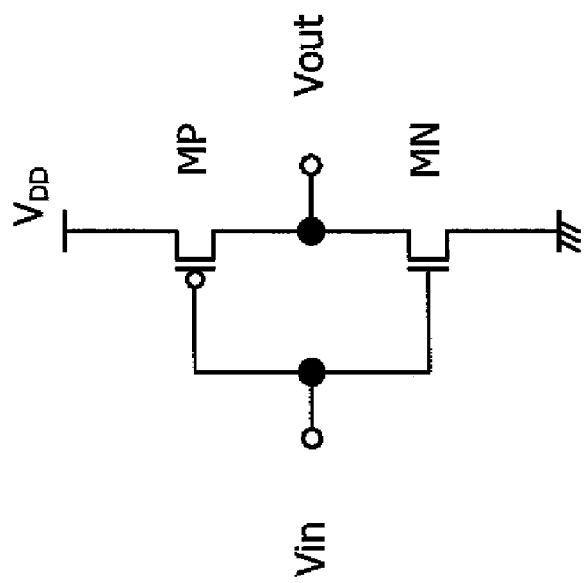
Figure 4:
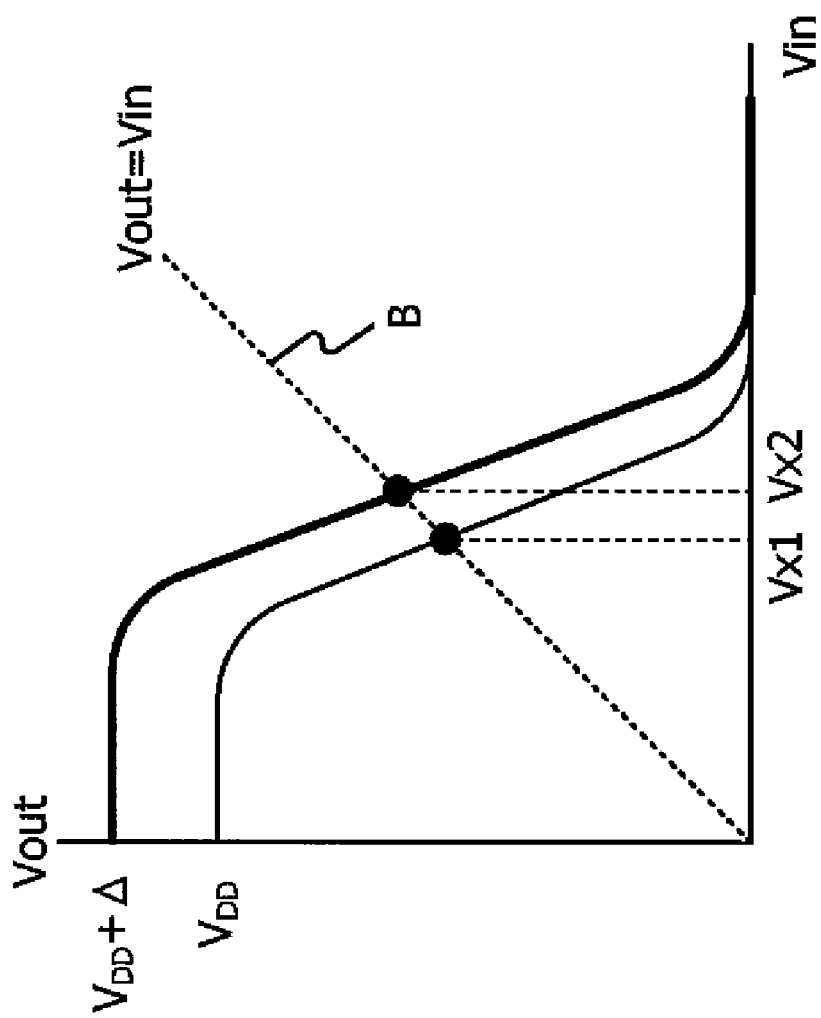
FIG. 4 is a view showing input/output characteristics and effect of power supply voltage fluctuation of the inverter circuit.
Figure 5:
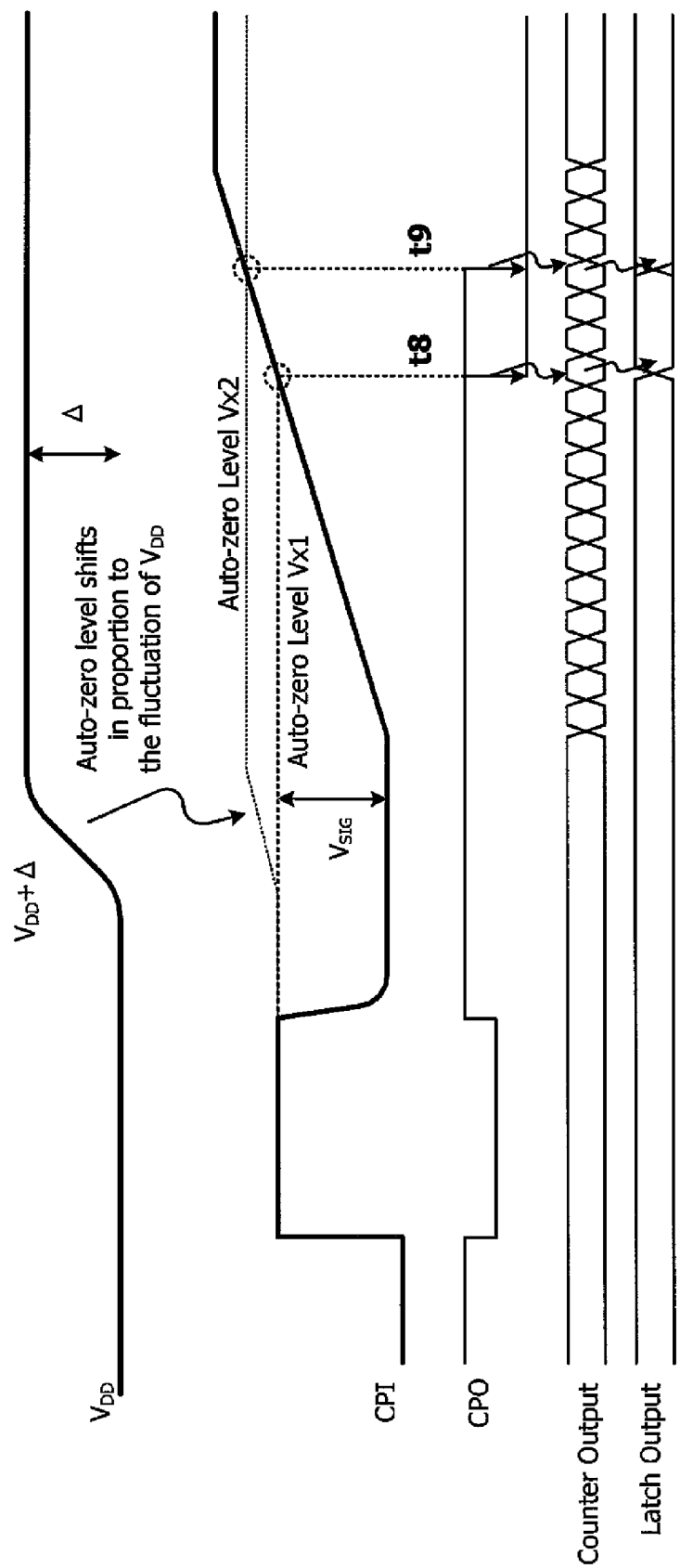
FIG. 5 is a view showing an effect of power supply voltage fluctuation on a latch output in the A/D converter shown in FIG. 1.

Although the A/D conversion operation of the device 1 of the present invention is the same as that of the conventional A/D converter shown in FIG. 1, in order to confirm the operation of the voltage comparison circuit of the device 1 of the present invention, it will be explained again with reference to an operation timing chart shown in FIG. 2.

During timing t1 to t3, a reset voltage is provided at the node VIN, the switch RS is turned on, the input node CPI and the output node CPO of the inverter circuit 12 are short-circuited, and the input node CPI is automatically reset to the input determination voltage (auto-zero level) of the inverter circuit 12. The switch SS is turned off within the same term.

At the timing t3, when the switch RS is turned off, the reset voltage of the node VIN is sampled in the capacitor CS.

Then, at a timing t4, the voltage of the node VIN starts to transit so that the analog voltage $V_{SIG}$ to be converted is generated as a difference voltage from the reset voltage. The voltage level of the node VIN is stabilized at a timing t5, the switch S3 is turned on, and a difference voltage between the voltage level of the node VIN at that time and an initial voltage of the ramp voltage $V_{RAMP}$ is held in the capacitor CR.

Then, at a timing t6, when the switch SS is turned off, a difference voltage $V_{SIG}$ between the reset voltage (timing t3) and the voltage at the timing t6 of the node VIN is held at the input node CPI as the analog voltage to be converted.

At a timing t7, when the voltage value of the ramp voltage $V_{RAMP}$ starts to increase gradually, the voltage at the input node CPI also increases so as to be proportional to the voltage increase of the ramp voltage $V_{RAMP}$ (the voltage increase of the input node CPI corresponds to the reference voltage). In addition, at the timing t7, the counter 15 starts to count at the same time. Therefore, the composite voltage provided by adding the difference voltage between the analog voltage $V_{SIG}$ to be converted and the reference voltage proportional to the voltage change value of the ramp voltage $V_{RAMP}$, to the input determination voltage Vx' (refer to the formula 6) of the inverter circuit 12 appears at the input node CPI.

At a timing t8, when the voltage level of the input node CPI exceeds the input determination voltage of the inverter circuit 12, that is, when the analog voltage $V_{SIG}$ to be converted equals the reference voltage, the inverter circuit 12 inverts the output level of the output node CPO. In response to the output change of the output node CPO, the latch circuit 13 holds the value of the counter output corresponding to the reference voltage at that time in response to output change of the output node CPO. When the latch circuit 13 outputs the A/D conversion value held at the timing 8t, the device 1 of the present invention completes the A/D conversion operation of the analog voltage $V_{SIG}$.

Second Embodiment

Although the description has been made of a case where one input node VIN for the analog voltage to be converted is provided in the circuit constitution of the device 1 of the present invention according to the first embodiment shown in FIG. 6, a description will be made of the device of the present invention in which a plurality (m pieces) of analog voltages to be converted can be A/D converted in parallel at the same time according to a second embodiment.

Figure 7:
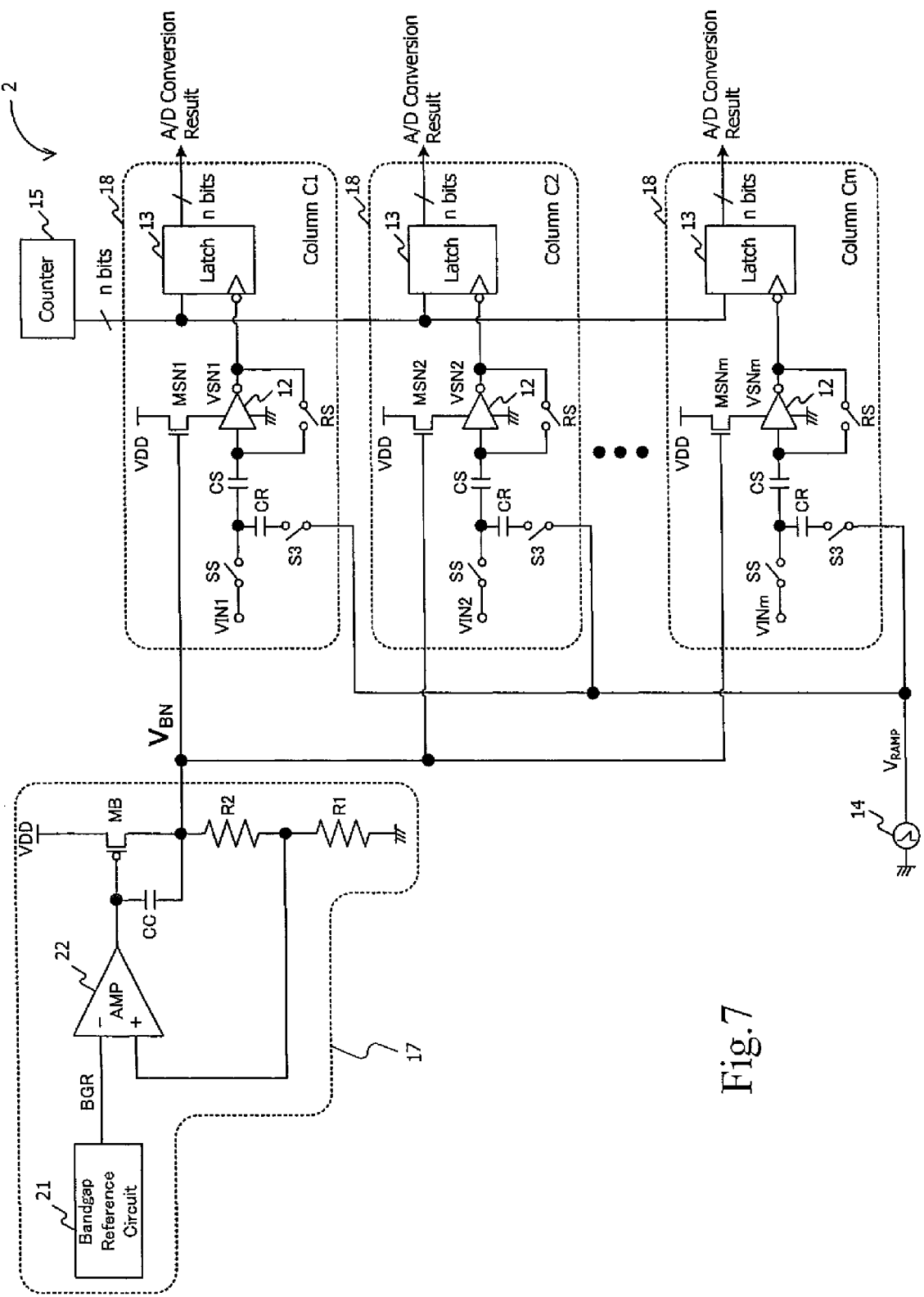
FIG. 7 is a circuit block diagram showing a circuit constitution example according to a second embodiment of the A/D converter in the present invention.

FIG. 7 is a circuit diagram of the device of the present invention according to the second embodiment. A device 2 of the present invention according to the second embodiment is configured with a plurality (m pieces) of A/D conversion units 18 performing the A/D conversion operation with respect to each analog voltage to be converted, a ramp voltage source 14, a counter 15 and a stabilized voltage source 17.

Each of the A/D conversion units 18 comprises a voltage comparison circuit comprising an inverter circuit 12, a transistor MSN, a switch RS, a switch SS and a capacitor CS, and a switch S3 and a capacitor CR, and a latch circuit 13. The ramp voltage source 14, the counter 15, and the stabilized voltage source 17 are commonly used by the plurality (m pieces) of A/D conversion units 18.

A ramp voltage $V_{RAMP}$ outputted from the ramp voltage source 14 is supplied to one end of the switch S3 of each A/D conversion unit 18. In addition, a counter output of the counter 15 is supplied to each trigger signal input of the latch circuit 13 of each A/D conversion unit 18. Furthermore, a voltage $V_{BN}$ outputted from the stabilized voltage source 17 is supplied to a gate terminal of the transistor MSNi (i=1 to m) of each A/D conversion unit 18. Since each of the A/D conversion unit 18, the ramp voltage source 14 and the counter 15 are the same as those in the first embodiment, their description will be omitted.

According to the first embodiment, a detailed description with respect to the circuit constitution of the stabilized voltage source 17 has been omitted because as long as the circuit can supply a stabilized voltage $V_{BN}$ that is not affected by the voltage fluctuation of the system power supply voltage $V_{DD}$, the circuit is not limited to a specific circuit, but according to the second embodiment, one circuit constitution example of the stabilized voltage source 17 will be described.

According to a silicon integrated circuit, in order to generate a stabilized voltage that does not depend on fluctuation of a power supply voltage, an operation temperature and a threshold voltage of a transistor, the so-called bandgap voltage can be taken out and used.

The stabilized voltage source 17 of the second embodiment comprises a bandgap reference circuit 21, an operation amplifier 22, a P channel-type MOSFET (transistor MB), a capacitor CC, and resistance elements R1 and R2. A voltage $V_{BGR}$, generated by the bandgap reference circuit 21 is not affected by the voltage fluctuation of a system power supply voltage $V_{DD}$ supplied to a source terminal of the transistor MB. When the voltage $V_{BGR}$ is converted to a voltage $V_{BN}$ having a certain voltage value by using the operation amplifier 22, the transistor MB, the capacitor CC, and the resistance elements R1 and R2 (resistance values are $R_1$ and $R_2$), as shown in the following formula 7.

$$V_{BN}=V_{BGR}\times(R_1+R_2)/R_1 \qquad (7)$$

It can be found from the formula 7, that any voltage $V_{BN}$ that is not affected by the voltage fluctuation of the system power supply voltage $V_{DD}$ can be generated.

When the output terminal VBN of the stabilized voltage source 17 is connected to the gate terminal of the transistor MSNi (i=1 to m) of the A/D conversion unit 18 prepared in each of columns C1 to Cm, the voltage $V_{BN}$ is supplied to each gate terminal.

As described in the first embodiment, since each of the transistors MSN1 to MSNm performs the source-follower operation, the voltage $V_{INV}$ shown in the formula 4 is supplied to the inverter circuit 12 of each A/D conversion unit 18. Therefore, the A/D conversion unit 18 in each of the columns C1 to Cm can perform the A/D conversion operation without being affected by the voltage fluctuation of the system power supply voltage $V_{DD}$ at the time of the A/D conversion operation.

Third Embodiment

According to the stabilized voltage source 17 in the second embodiment shown in FIG. 7, the amplification circuit at a subsequent stage is a 2-stage amplifier in the circuit constitution. The amplification circuit having two stages or more is likely to be unstable when a load capacity is increased in general. In order to ensure a stable operation, it is necessary to s appropriately select a phase compensation capacitor CC.

Figure 8:
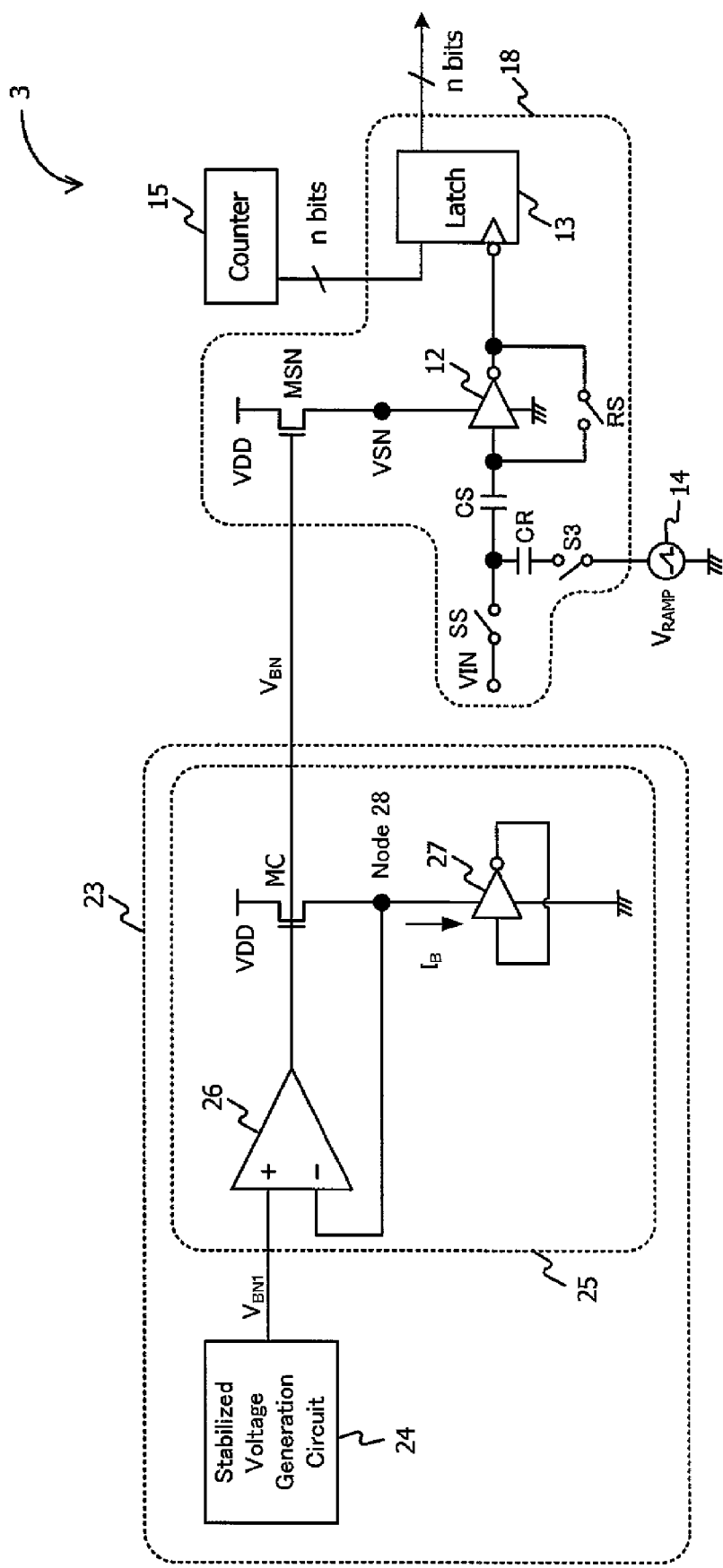
FIG. 8 is a circuit block diagram showing a circuit constitution example according to a third embodiment of the A/D converter in the present invention.

FIG. 8 shows a stabilized voltage source 23 according to a third embodiment configured with a stabilization voltage generation circuit 24 to generate a stabilized voltage $V_{BN1}$ and a one-stage amplification circuit 25. The amplification circuit 25 is configured with an operation amplifier 26, an N channel-type MOSFET (transistor MC), and an inverter circuit 27 whose input and output terminals are short-circuited. The inverter circuit 27 is a duplication of an inverter circuit 12 provided in each A/D conversion unit 18 and has the same electric characteristics. The transistor MC is a duplication of the transistor MSN in each A/D conversion unit 18 and has the same gate length, same gate width and same transistor characteristics.

The stabilized voltage $V_{BN1}$ is provided at a node 28 in the circuit constitution shown in FIG. 8. When the stabilized voltage $V_{BN1}$ is supplied to the inverter 27 whose input and output terminals are short-circuited, as a power supply voltage, a reference current $I_B$ at the time of auto-zero is determined. Since the reference current $I_B$ flows in the transistor MC, the same reference current $I_B$ flows in the transistor MSN in each A/D conversion unit 18. Therefore, the node 28 and a first power supply line VSN in each A/D conversion unit 18 are at the same voltage, and the first power supply line VSN is at the stabilized voltage $V_{BN1}$. As a result, the A/D conversion unit 18 can perform the conversion operation without being affected by the voltage fluctuation of the system power supply voltage $V_{DD}$ at the time of the AD conversion operation.

Fourth Embodiment

Although the inverter circuit 12 is used as a arithmetic unit to compare the reference voltage with the analog voltage to be converted in the device of the present invention according to the first to third embodiments, a differential amplifier is used as the arithmetic unit in the device of the present invention according to a fourth embodiment.

Figure 9:
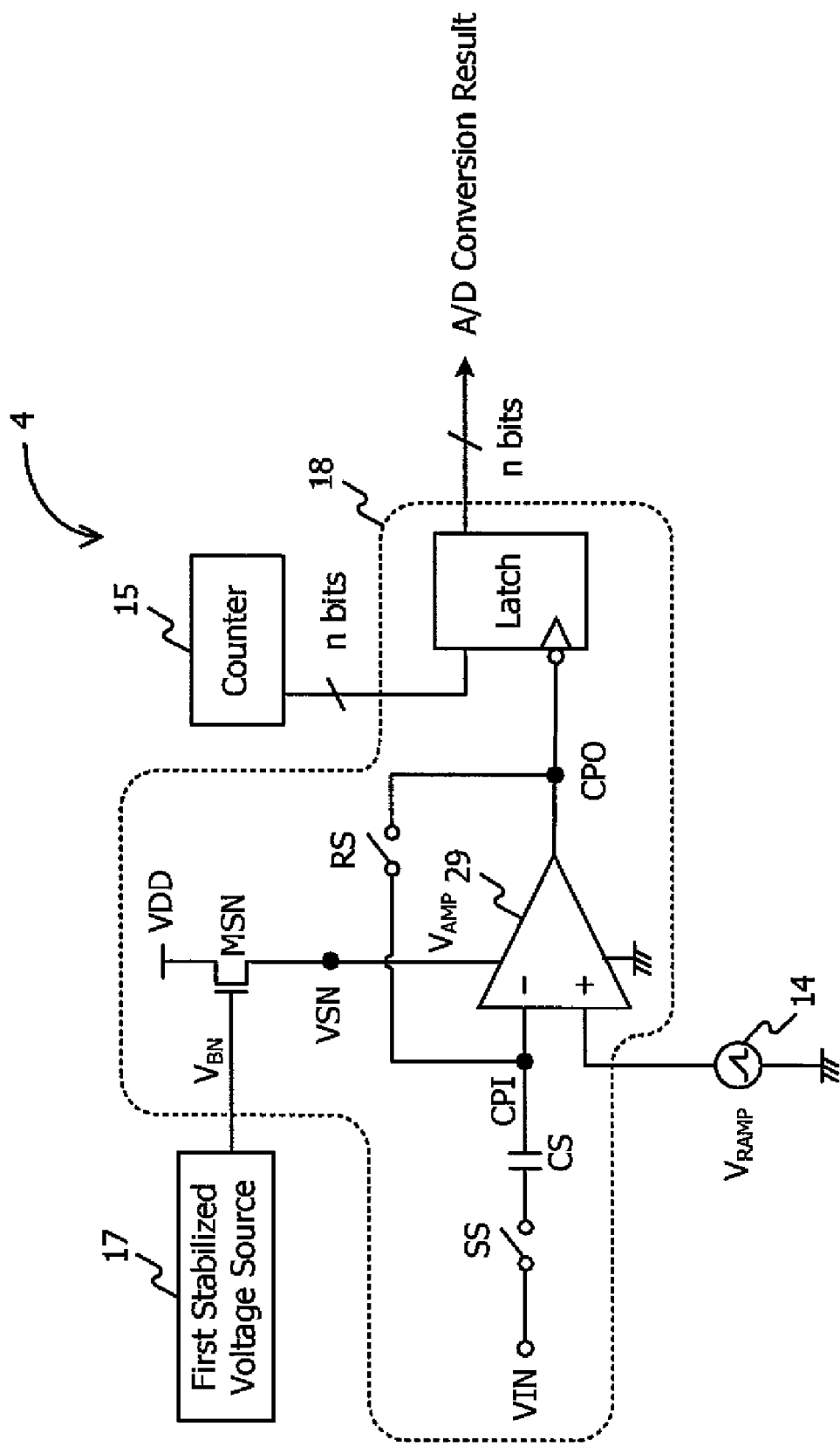
FIG. 9 is a circuit block diagram showing a circuit constitution example according to a fourth embodiment of the A/D converter in the present invention.

As shown in FIG. 9, a device 4 of the present invention according to the fourth embodiment comprises a differential amplifier 29 comprising an operation amplifier, a switch RS to short-circuit an inversion input node CPI and an output node CPO of the differential amplifier 29, a switch SS and a capacitor CS to sample an inputted analog voltage to be converted from an input node VIN of the device 4 of the present invention, a latch circuit 13 to latch a counter output corresponding to the analog voltage to be converted, a ramp voltage source 14 to generate a ramp voltage $V_{RAMP}$, and a counter 15 to count a digital value (n-bit binary signal) corresponding to a reference voltage that is a voltage change value of the ramp voltage $V_{RAMP}$. According to the fourth embodiment, since the reference voltage can be directly supplied to a non-inversion input node of the differential amplifier 29, the switch S3 and the capacitor CR needed to transmit the reference voltage to the input node CPI in the first to third embodiments can be omitted. According to this circuit constitution, a circuit area can be reduced.

In addition, since the differential amplifier 29 has a high power supply rejection ratio (PSRR) as compared with the inverter circuit 12, when the differential amplifier 29 is used as an arithmetic unit for comparing the voltage instead of the inverter circuit 12, the A/D conversion result is hardly affected by the voltage fluctuation of a system power supply voltage $V_{DD}$.

However, in order to raise the PSRR of the differential amplifier 29, there is a trade-off such that it needs a large area, high power and a complicated amplifier constitution. In order to implement the differential amplifier having a simple circuit constitution, a small circuit area, saved power, and high PSRR, as shown in FIG. 9, a first power supply line VSN to supply a special power supply voltage $V_{AMP}$ to the differential amplifier 29, and a system power supply line VDD are separately provided, so that the voltage fluctuation of the system power supply voltage $V_{DD}$ does not affect the first power supply line VSN. According to the device 4 of the present invention, similar to the first embodiment, an N channel-type MOFSFET (transistor MSN) having a source terminal and a drain terminal connected to the first power supply line VSN and the system power supply line $V_{DD}$, respectively and a first stabilized voltage source 17 to supply a stabilized voltage $V_{BN}$ that is not affected by the voltage fluctuation of the system power supply voltage $V_{DD}$, to a gate terminal of the transistor MSN are provided. Since the transistor MSN performs the source-follower operation, a voltage $V_{AMP}$ expressed by the following formula 8 is provided in the first power supply line VSN. In the formula 8, Vthsn and βsn are a threshold voltage of the transistor MSN and conductivity coefficient β expressed by the formula 5, respectively and $I_B$ is a bias current penetrating the differential amplifier 29 at the time of auto-zero (the input node CPI and the output node CPO are short-circuited).

$$V_{AMP} = V_{BN} - Vthsn - (2 \times I_B/\beta sn)^{1/2} \quad (8)$$

As is clear from the formula 8, the power supply voltage $V_{AMP}$ that is not affected by the voltage fluctuation of the system power supply voltage $V_{DD}$ is supplied to the differential amplifier 29. As a result, the voltage fluctuation of the system power supply voltage $V_{DD}$ hardly affects an A/D conversion result. Thus, according to the device 4 of the present invention, while the circuit area and the operation power can be reduced, the A/D conversion can be performed without being affected by the power supply voltage fluctuation.

Fifth Embodiment

The description has been made of the device of the present invention in which the voltage fluctuation of the system power supply voltage $V_{DD}$ is prevented from affecting the A/D conversion result in the first to fourth embodiments. However, voltage fluctuation of a ground voltage could cause the fluctuation of the A/D conversion result. According to a fifth embodiment, a description will be made of a device of the present invention in which voltage fluctuation of a system ground voltage is prevented from affecting the A/D conversion result.

First, with reference to a model diagram shown in FIG. 10, a description will be made of a voltage rising mechanism of a ground voltage due to a wiring resistance Rp of a ground voltage supply line.

According to a silicon integrated circuit, it is difficult to obtain a ground voltage in which impedance is zero. When m pieces of column-type A/D converters are operated in parallel, the ground voltages supplied to each inverter circuits 12 of a column C1, a column C2, ... column Cm are different in many cases.

Figure 10:
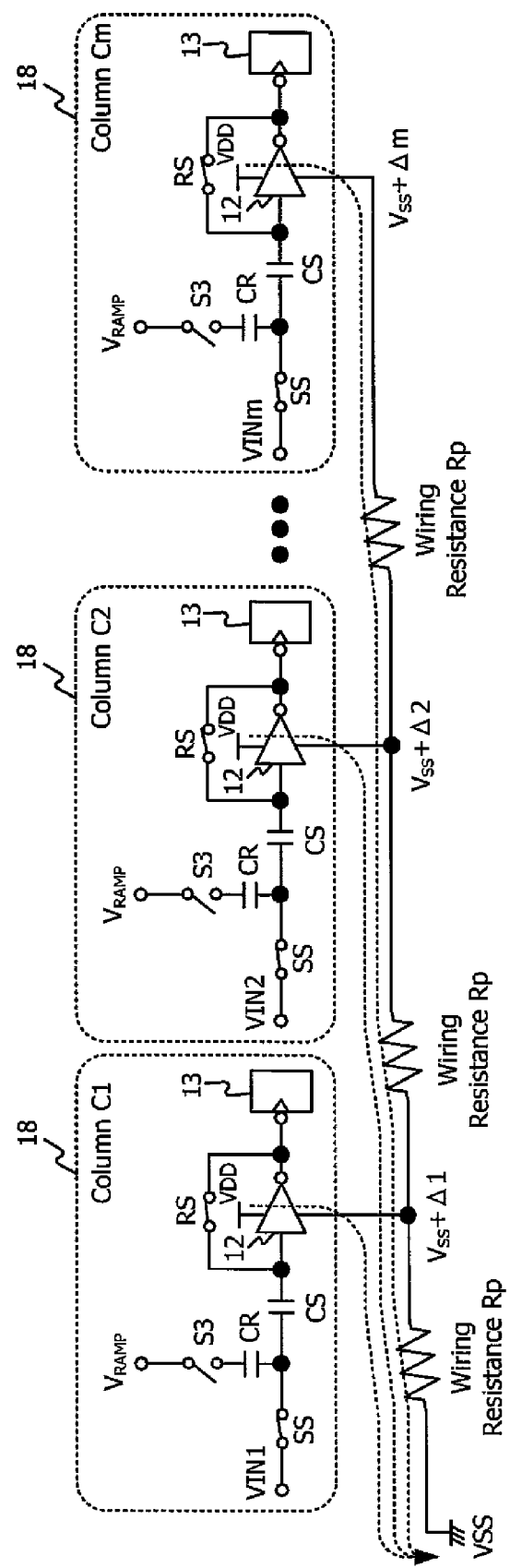
FIG. 10 is a model view of voltage rise due to wiring resistance of a ground voltage supply line of the conventional column-type A/D converter.

FIG. 10 shows a case where ground voltage supply lines to the column C1, column C2, ... column Cm are connected. Since an operation current from each of the columns C1 to Cm flows through a wiring resistance Rp of the ground voltage supply line, the ground voltage rises.

As a result, when it is assumed that the system ground voltage common to a system is $V_{SS}$, the ground voltages supplied to the A/D conversion units 18 (refer to FIG. 7) of the columns C1 to Cm are $V_{SS}+\Delta 1, V_{SS}+\Delta 2, \ldots V_{SS}+\Delta m$, respectively. Here, $\Delta 1$ to $\Delta m$ are voltage drop amount due to the current flowing through the wiring resistance Rp.

Figure 11:
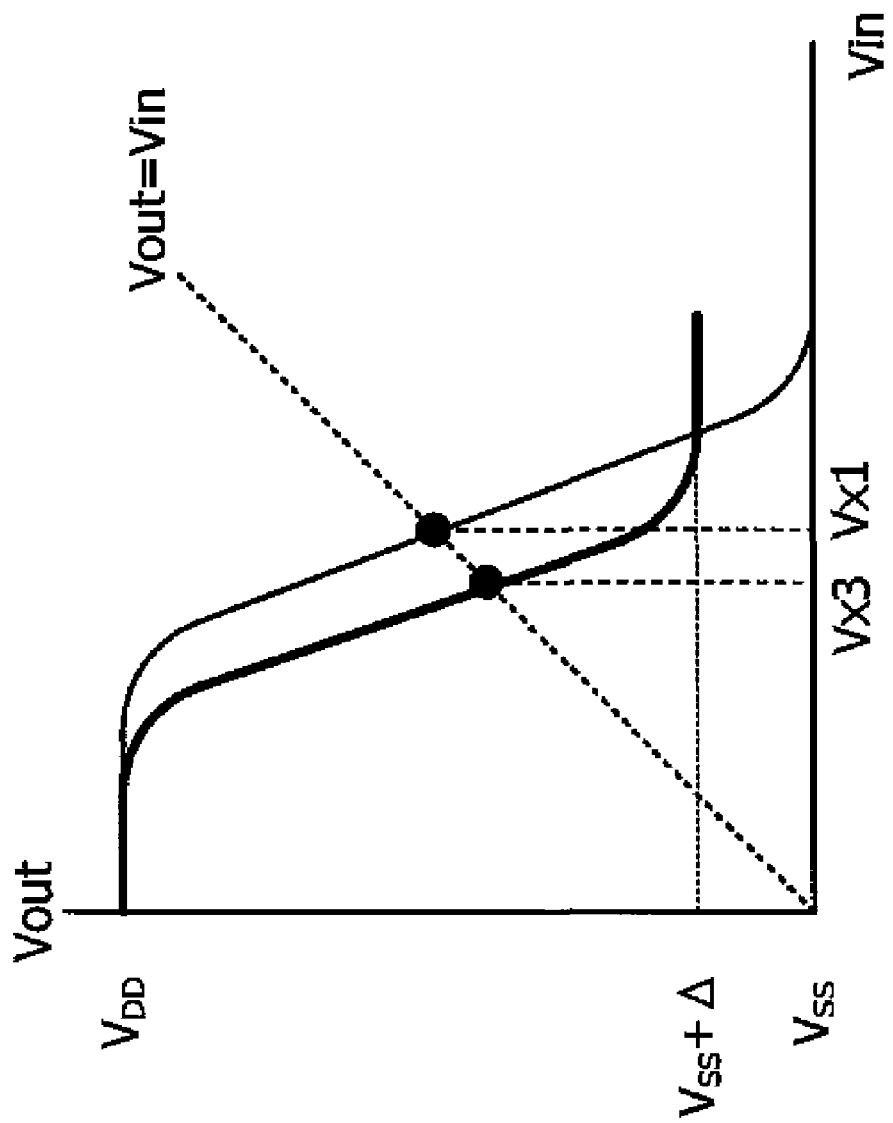
FIG. 11 is a view showing input/output characteristics and an effect of ground voltage fluctuation of the inverter circuit.

FIG. 11 shows input/output characteristics of the inverter circuit when the ground voltage $V_{SS}$ is fluctuated. As shown in FIG. 11, when the ground voltage $V_{SS}$ is fluctuated by a voltage Δ, an auto-zero level Vx is fluctuated from Vx1 to Vx3 as seen from the graph.

The ground voltage supplied to the A/D conversion unit 18 of each of the columns C1 to Cm varies depending on a current amount flowing in the wiring resistance Rp and there. When the A/D conversion unit 18 of each of the columns C1 to Cm is operated at a certain timing, the fluctuation of the operating current causes the fluctuation of the ground voltage of the A/D conversion unit 18. Since the fluctuation of the ground voltage causes the fluctuation of the auto-zero level Vx, it causes the fluctuation of the A/D conversion result.

Figure 12:
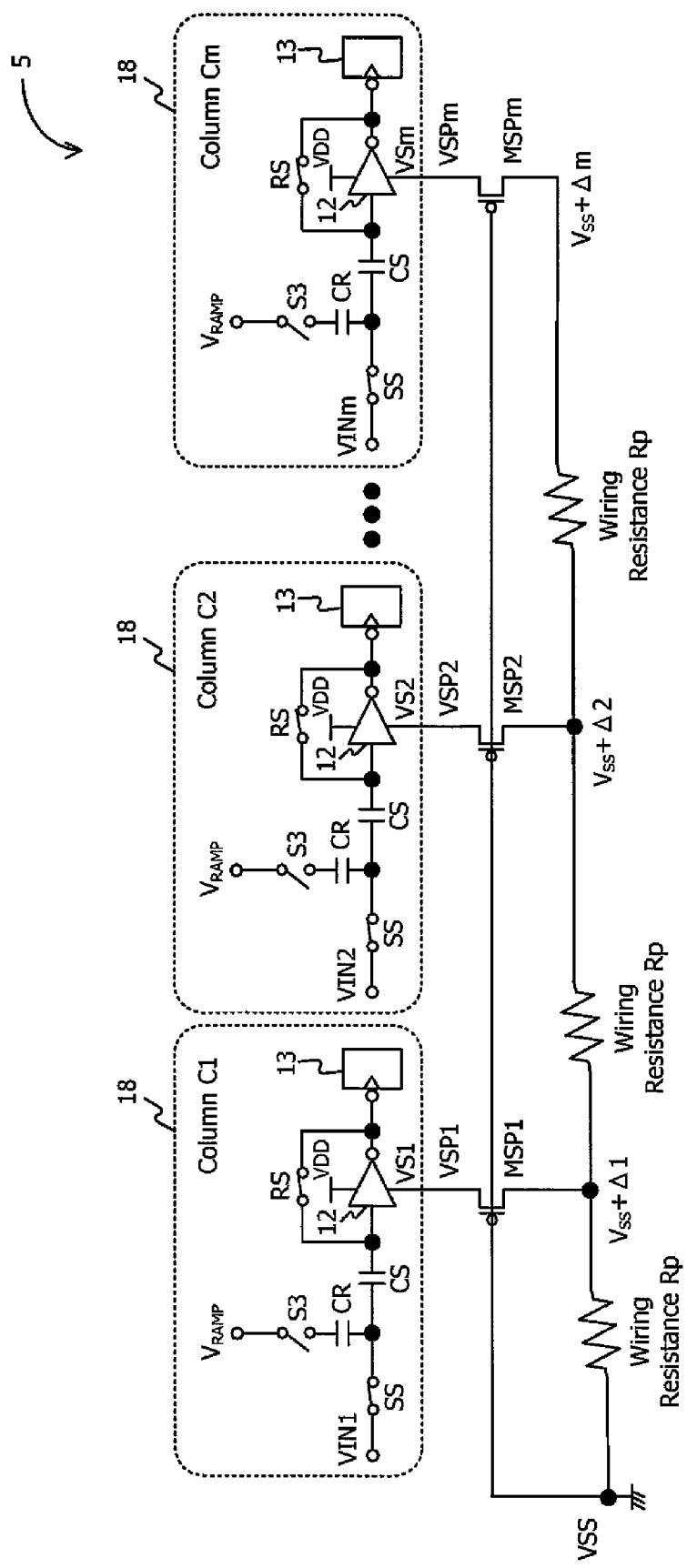
FIG. 12 is a circuit block diagram showing a circuit constitution example according to a fifth embodiment of the A/D converter in the present invention.

FIG. 12 shows an essential circuit constitution of the device 5 of the present invention in which the voltage fluctuation of the ground voltage is prevented from affecting the A/D conversion. A first ground voltage line VSPi (i=1 to m) to supply a special ground voltage VSi (i=1 to m) to the inverter circuit 12 of the A/D conversion unit 18 of each of the columns C1 to Cm, and a system ground voltage line VSS (corresponding to a second ground voltage line) to supply the system ground voltage $V_{SS}$ to the whole system except for the inverter circuit 12 are separately provided, so that the first ground voltage line VSPi (i=1 to m) is not affected by the voltage fluctuation of the system ground voltage $V_{SS}$. In addition, since the circuit constitution of the A/D conversion unit 18 of each of the columns C1 to Cm, and a ramp voltage source 14 and a counter 15 (refer to FIG. 7) around the unit (not shown) are the same as those in the first to third embodiments, their description will be omitted.

According to the device 5 of the present invention, in order to avoid the troublesome operation to supply the ground voltage different from the system ground voltage $V_{SS}$ from the outside to the first ground voltage VSPi (i=1 to m), a P channel-type MOSFET (transistor MSPi, i=1 to m) whose source terminal and drain terminal connected to the first ground voltage line VSPi (i=1 to m) and the system ground voltage line VSS, respectively is provided and a gate terminal of the transistor MSPi is connected to the system ground voltage line VSS branched at an end near the outside. Each transistor MSPi has the same gate length, gate width and transistor characteristics.

As shown in FIG. 12, the source terminal of the transistor MSPi is connected to the first ground voltage VSPi (i=1 to m), and a source-follower voltage VSi (i=1 to m) can be provided. More specifically, the ground voltage VSi (i=1 to m) supplied to the first ground voltage line VSPi is expressed by the following formula 9. In the formula 9, Vthsp and βsp are a threshold voltage of the transistor MSP and conductivity coefficient β expressed by the formula 5, respectively and $I_{Bi}$ (i=1 to m) is a penetration current penetrating the inverter circuit 12 at the time of auto-zero (the input node CPI and the output node CPO are short-circuited).

$$VSi = V_{SS} + Vthsp + (2 \times I_{Bi}/\beta Sp)^{1/2} \quad (9)$$

As can be clear from the formula 9, the ground voltage VSi (i=1 to m) of the A/D conversion unit 18 of each of the columns C1 to Cm is determined only by depending on the penetration current $I_{Bi}$ (i=1 to m) of the inverter circuit 12, it is separated from the fluctuations $V_{SS}+\Delta 1$ to $V_{SS}+\Delta m$ of the system ground voltages fluctuating at various timings. Therefore, according to the circuit constitution shown in FIG. 12, the fluctuation of the system ground voltage is prevented from affecting the A/D conversion result.

Sixth Embodiment

Figure 13:
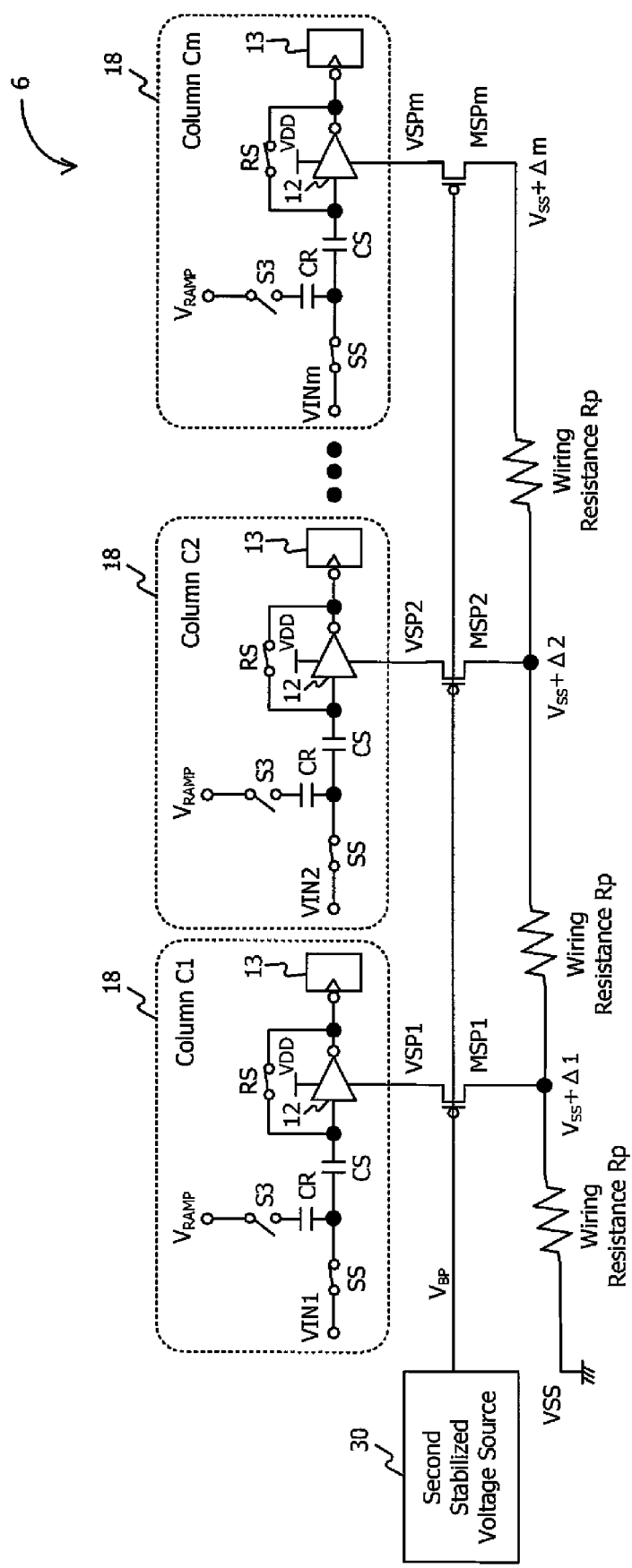
FIG. 13 is a circuit block diagram showing a circuit constitution example according to a sixth embodiment of the A/D converter in the present invention.

A device 6 of the present invention according to a sixth embodiment is a variation of the device 5 of the present invention according to the fifth embodiment. It is different from the fifth embodiment in that as shown in FIG. 13, an output terminal of a second stabilized voltage source 30 is commonly connected to a gate terminal of a transistor MSPi of a A/D conversion unit 18 of each of the columns C1 to Cm. In addition, the second stabilized voltage source 30 can use the same circuit constitution as the first stabilized voltage source 17 in the second to third the present invention (however, it is to be noted that it is a symmetric circuit constitution in which the relation between the power supply voltage and the ground voltage and the conductivity types of the MOSFET are inverted).

As a result, according to the sixth embodiment, since the stabilized voltage $V_{BP}$ that is not affected by the fluctuation of the system ground voltage $V_{SS}$ can be outputted from the second stabilized voltage source 30 and supplied to each gate terminal, similar to the fifth embodiment, the fluctuation of the system ground voltage is prevented from affecting the A/D conversion result in the device 6 of the present invention.

Seventh Embodiment

Figure 14:
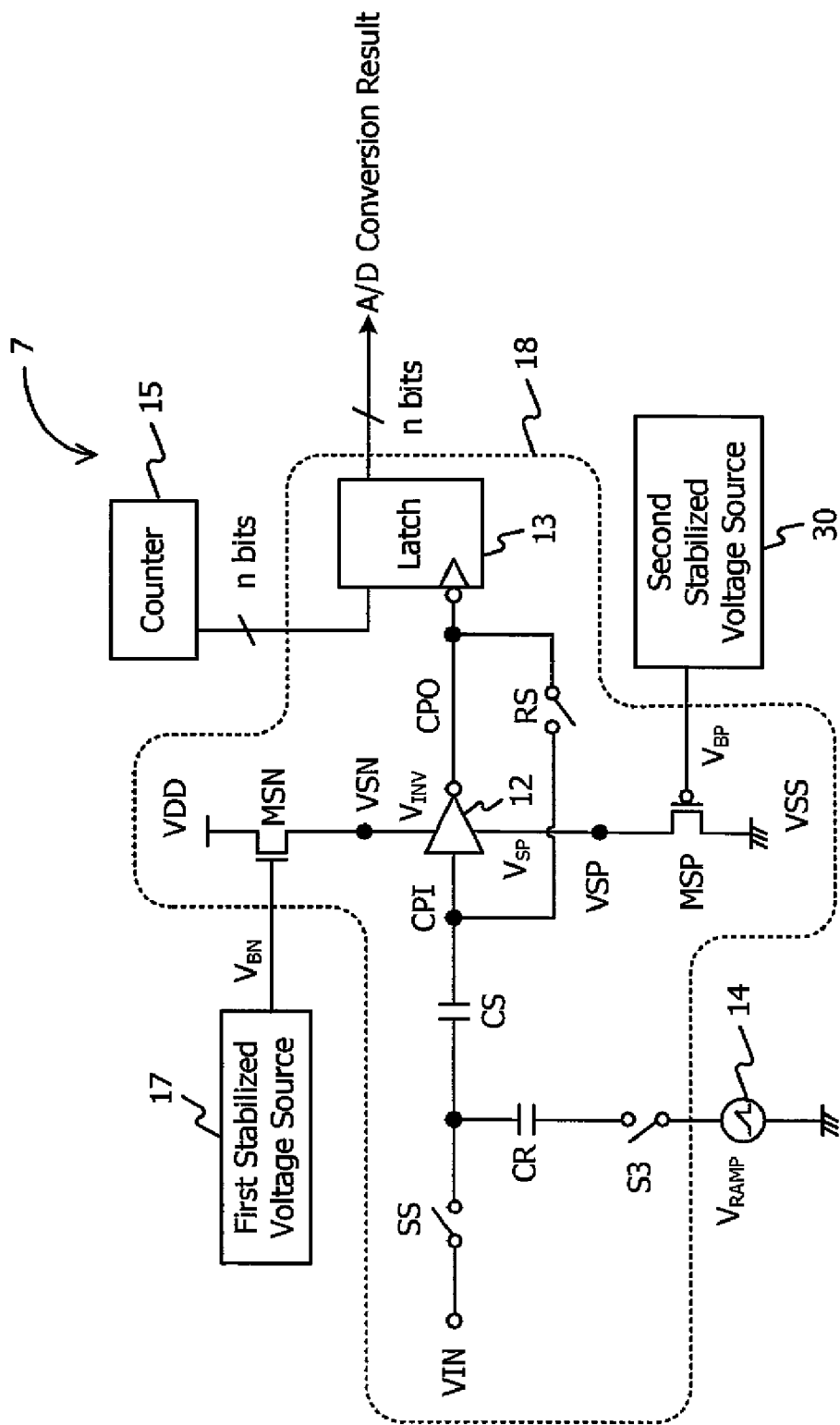
FIG. 14 is a circuit block diagram showing a circuit constitution example according to a seventh embodiment of the A/D converter in the present invention.

A device 7 of the present invention according to a seventh embodiment has characteristics of both device 1 of the present invention according to the first embodiment and device 6 of the present invention according to the sixth embodiment, as shown in FIG. 14, and is configured with a circuit constitution in which both of the voltage fluctuation of the system power supply voltage $V_{DD}$ and the voltage fluctuation of the system ground voltage are prevented from affecting the A/D conversion result.

More specifically, as shown in FIG. 14, a first power supply line VSN to supply a special power supply voltage $V_{INV}$ to an inverter circuit 12, and a system power supply line $V_{DD}$ (corresponding to a second power supply line) to supply a system power supply voltage $V_{DD}$ to a whole system except for the inverter circuit 12 are separately provided and an N channel-type MOSFET (transistor MSN) whose source terminal and drain terminal connected to the first power supply line VSN and the system power supply line VDD, respectively and a first stabilized voltage source 17 to supply a stabilized voltage $V_{BN}$ that is not affected by the voltage fluctuation of the system power supply voltage $V_{DD}$, to a gate terminal of the transistor MSN are provided. Furthermore, a first ground voltage line VSP to supply a special ground voltage $V_{sp}$ to the inverter circuit 12, and a system ground voltage line VSS (corresponding to a second ground voltage line) to supply a system ground voltage $V_{SS}$ to the whole system except for the inverter circuit 12 are separately provided, and a P channel-type MOSFET (transistor MSP) whose source terminal and drain terminal connected to the first power supply line VSP and the system ground voltage line VSS, respectively and a second stabilized voltage source 30 to supply a stabilized voltage $V_{BP}$ that is not affected by the system ground voltage $V_{SS}$, to a gate terminal of the transistor MSP are provided. In addition, since each circuit element shown in FIG. 14 is the same as that described in the first to sixth embodiments, its description will be omitted.

As described above, according to the circuit constitution shown in FIG. 14, the auto-zero level Vx of the inverter circuit 12 is separated from the fluctuation of the system power supply voltage $V_{DD}$ and the fluctuation of the system ground voltage $V_{SS}$, so that the stable A/D conversion result can be provided.

Another Embodiment

Although the devices of the present invention have been described in detail in the first to seventh embodiments, the circuit constitution of the device of the present invention is not limited to the above circuit constitution in each of the above embodiments. The characteristic constitution of the device of the present invention described in claim can effectively function in an A/D converter having a constitution in which one or more analog voltages to be converted are sampled and held and the sampled and held one or more analog voltages to be converted are compared with a reference voltage given by a voltage change value of a ramp voltage having a voltage value changing monotonically for a certain period or a voltage proportional to the voltage change value, using an arithmetic unit such as an inverter circuit or a differential amplifier, and each of the one or more analog voltages to be converted are converted to a digital value corresponding to the reference voltage to be outputted, that is, an A/D converter having a circuit constitution in which an auto-zero level of the arithmetic unit used for voltage comparison is changed by fluctuation of a power supply voltage or a ground voltage.

The present invention can be applied to the A/D converter and more effectively to the column-type A/D converter.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. An A/D converter for sampling and holding one or more analog voltages to be converted, comparing the sampled and held one or more analog voltages to be converted with a reference voltage given by a voltage change value of a ramp voltage having a voltage value changing monotonically for a certain period or a voltage proportional to the voltage change value, converting each of the one or more analog voltages to be converted to a digital value corresponding to the reference voltage, and outputting it, wherein an arithmetic unit that compares each of the one or more analog voltages to be converted with the reference voltage is provided with respect to each of the analog voltages to be converted, each arithmetic unit provided with respect to each of the analog voltages to be converted including a first power supply line for receiving a power supply voltage individually, and each first power supply line being provided as another power supply line not affected by a voltage fluctuation of a second power supply line for supplying a power supply voltage to circuits other than each arithmetic unit provided with respect to each of the analog voltages to be converted.

2. The A/D converter according to claim 1, further comprising:

an N channel-type MOSFET having a source terminal and a drain terminal connected to the first power supply line and the second power supply line, respectively; and a first stabilized voltage source for outputting a stabilized voltage not affected by the voltage fluctuation of the second power supply line, to a gate terminal of the N channel-type MOSFET.

3. The A/D converter according to claim 1, wherein a first ground voltage line for supplying a ground voltage to each arithmetic unit provided with respect to each of the analog voltages to be converted is provided as another ground voltage line not affected by a voltage fluctuation of a second ground voltage line for supplying a ground voltage to circuits other than each arithmetic unit provided with respect to each of the analog voltages to be converted.

4. The A/D converter according to claim 3, further comprising:

a P channel-type MOSFET having a source terminal and a drain terminal connected to the first ground voltage line and the second ground voltage line, respectively; and a second stabilized voltage source for outputting a stabilized voltage not affected by the voltage fluctuation of the second ground voltage line, to a gate terminal of the P channel-type MOSFET.

5. The MD converter according to claim 2, wherein a plurality of analog voltages are converted by a plurality of arithmetic units, with each arithmetic unit of the plurality of arithmetic units respectively converting a corresponding one of the plurality of analog voltages, a plurality of gate terminals of a plurality of N channel-type MOSFETs that are each connected to respective corresponding ones of first power supply lines of the plurality of arithmetic units are connected to each other, and an output voltage of the first stabilized voltage source is outputted to each of the plurality of gate terminals of the plurality of N channel-type MOSFETs.

6. The A/D converter according to claim 4, wherein a plurality of analog voltages are converted by a plurality of arithmetic units, with each arithmetic unit of the plurality of arithmetic units respectively converting a corresponding one of the plurality of analog voltages, a plurality of gate terminals of a plurality of P channel-type MOSFETs that are each connected to respective corresponding ones of first ground voltage lines of the plurality of arithmetic units are connected to each other, and an output voltage of the second stabilized voltage source is outputted to each of the plurality of gate terminals of the plurality of P channel-type MOSFETs.

7. The A/D converter according to claim 1, further comprising:

a ramp voltage generator unit for generating the ramp voltage;

a counter for counting a digital value corresponding to the reference voltage and outputting it;

a voltage comparison circuit for sampling and holding the analog voltage to be converted and comparing the reference voltage with the analog voltage to be converted by each arithmetic unit provided with respect to each of the analog voltages to be converted, and changing an output when the reference voltage equals the analog voltage to be converted; and a latch circuit for latching the digital value outputted from the counter when the output of the voltage comparison circuit is changed, and outputting the latched digital value.

8. The A/D converter according to claim 1, wherein each arithmetic unit provided with respect to each of the analog voltages to be converted comprises an inverter circuit, the A/D converter further comprising a voltage synthesis circuit for generating a composite voltage provided by adding a differential voltage between the analog voltage to be converted and the reference voltage, to an input determination voltage of the inverter circuit, as an input voltage of the inverter circuit.

9. The A/D converter according to claim 1, wherein each arithmetic unit provided with respect to each of the analog voltages to be converted comprises a differential input type operation amplifier receiving the analog voltage to be converted and the ramp voltage as input voltages.

\* \* \* \* \*